Nov. 17, 1959 D. I. KOSOWSKY 2,913,580

CRYSTAL DISCRIMINATOR NETWORK

Filed Aug. 17, 1956

Inventor
David I. Kosowsky
by
Robert S. Toperzer Atty.

United States Patent Office 2,913,580

Patented Nov. 17, 1959

2,913,580

CRYSTAL DISCRIMINATOR NETWORK

David I. Kosowsky, West Newton, Mass., assignor to Hermes Electronics Co., Cambridge, Mass., a corporation of Delaware Application August 17, 1956, Serial No. 604,683

2 Claims. (Cl. 250—27)

This invention relates to the detection of frequency modulated signals, and in particular it relates to crystal discriminator networks.

In certain applications, a discriminator network which makes use of a piezoelectric crystal as a frequency sensitive impedance element is superior to the more conventional type discriminator wherein lumped capacitances and inductances are employed exclusively. For example, where it is required that the center frequency at which the discriminator is designed to operate be maintained within very close tolerance limits, the inherent frequency stability of a crystal is especially advantageous. Then too, by virtue of the rapid change in reactance exhibited by a crystal as a function of frequency, the sensitivity of a crystal discriminator is relatively high as is especially desirable in the detection of relatively narrow band signals. Hitherto one of these very characteristics of a crystal which makes it most useful in many discriminator applications, however, namely its reactance vs. frequency characteristic, has prevented its use in certain other applications.

That is to say, the width of the band over which a conventional crystal discriminator is capable of operating is strictly limited by the frequency separation between the resonant and antiresonant frequencies of the crystal (or crystals) employed therein. Although some increase in this frequency separation characteristic (zero-pole spacing) can be achieved by appropriate grinding techniques, the extent to which this can be done is also limited, and furthermore, the broader is the zero-pole spacing, in general, the less desirable is the crystal from the standpoint of spurious modes.

It is an object of this invention, therefore, to provide a highly sensitive discriminator network which employs a piezoelectric crystal as a frequency sensitive impedance element and which has a broader bandwidth than has been generally associated with crystal discriminators hitherto.

It is a further object of the invention to provide a discriminator network of the above-mentioned character which has substantially the same frequency stability as is generally associated with a piezoelectric crystal.

The novel features of the invention, together with further objects and advantages thereof, will become more readily apparent from the following description and the accompanying drawing to which the description refers. In the drawing.

Figure 1:
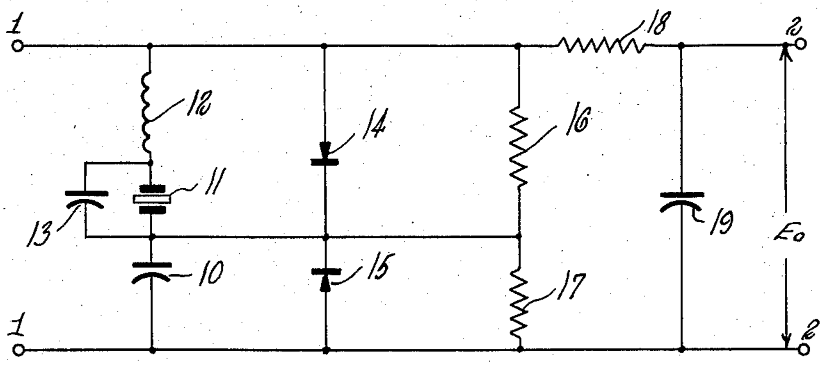
Fig. 1 is a schematic diagram of the discriminator network according to the present invention.

With reference now to the drawing, and in particular Fig. 1 thereof, it will be observed that the discriminator network according to the present invention has a pair of input terminals 1—1 and a pair of output terminals 2—2. Connected across the input terminals is a voltage dividing circuit formed with a capacitor 10 and a combination of impedance elements including a piezoelectric crystal 11 which is serially connected to the capacitor 10. In addition to the piezoelectric crystal, the aforementioned combination includes an inductor 12 in series relation to the crystal and a capacitor 13 in parallel thereto. The capacitor 10 has a relatively constant impedance over the operating band of frequencies whereas the combination including the crystal has a reactance which changes relatively sharply from one end of the band to the other. Consequently, the amount of voltage developed across the capacitor will be relatively constant as compared wtih the voltage across the remainder of the circuit, the latter being highly dependent upon the absolute instantaneous frequency of the signal to be detected.

To convert this voltage relation into a useable output signal, there is provided a balanced rectifier circuit adapted to furnish a direct output voltage representative of the difference in magnitude between the voltage across the capacitor 10 and the voltage across the combination including crystal 11. As shown in Fig. 1, such a balanced rectifier circuit may conventionally comprise a pair of serially connected rectifying elements 14 and 15 coupled across the voltage dividing circuit, and a pair of like resistors 16 and 17 serially connected across the combination of the rectifying elements. The individual junctions with one another of the resistors, and of the rectifying elements are connected to the junction of the crystal 10 with the capacitor 11. The required difference voltage appears across the circuit formed with resistors 16 and 17, provided that the polarities of the rectifying elements are opposite to one another as the diagram indicates.

Completing the network is a resistor 18 and a capacitor 19 connected in series with one another, and in parallel relation to the balanced resistor circuit. The capacitor 19 serves as the output circuit to which the output terminals 2—2 are connected, and with resistor 18 appropriately governs the regulation of the output voltage so that its magnitude will closely follow the frequency deviations of the input voltage. The values of resistor 18 and capacitor 19 necessary to accomplish this result can be established in accordance with well known principles, which are not material to the present invention.

Figure 2:
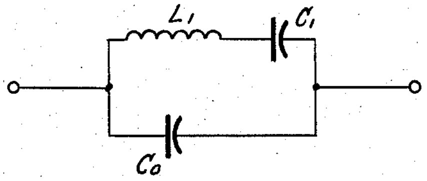
Fig. 2 is a schematic diagram of the equivalent circuit of the piezoelectric crystal employed in the network of Fig. 1.

In Fig. 2 there is illustrated an equivalent circuit for the piezoelectric crystal 11 comprising an inductor $L_1$ and a capacitor $C_1$ in series relation to one another, and a shunt capacitor $C_0$ in parallel relation to the series combination of the inductor $L_1$ and the capacitor $C_1$. It follows from the form of the equivalent circuit for the crystal that the same has associated therewith both a resonant frequency $f_a$ where the impedance of the crystal is zero and an antiresonant frequency $f_b$ where the impedance of the crystal is infinite. Although it will be recognized that this is an idealized representation of the crystal and that in fact the crystal has a finite but very small impedance at the resonant frequency and a very large but finite impedance at the antiresonant frequency, nevertheless, the mode of operation of the crystal in the network according to the present invention may be analyzed on this basis. Thus, the frequency separation $S_a$ between the resonant and antiresonant frequencies $f_a$ and $f_b$ (zero-pole spacing) may be defined by the formula $$S_a = \frac{f_a C_1}{2C_0}$$

An illustrative value of $S_a$ would be roughly .0025 $f_a$ and in conventional discriminator networks the maximum bandwidth which can be detected is substantially less than $S_a$. This is because a crystal exhibits a very rapid change of reactance with frequency only in the range between its resonant and antiresonant frequencies, and further, only within a limited portion of this range does the reactance characteristic approximate a linear function of frequency. According to the invention, however, the inductor 12 is adapted to resonate with the shunt capacitance $C_0$ of the crystal in the vicinity of its resonant frequency thereby effectively increasing the zero-pole spacing $S_a$. More particularly, what happens is that the antiresonant frequency, $f_b$, remains substantially the same while the resonant frequency, $f_a$, is decreased appreciably. As a practical matter, owing to the fact that the value of the shunt capacitance $C_0$ is very small, it has been found convenient to provide across the crystal a small capacitor, such as the capacitor 13, in order to increase, in effect, the shunt capacitance of the crystal. Inductor 12, therefore, is actually adapted to resonate with the sum of the shunt capacitance $C_0$ of the crystal and the added shunt capacitance of capacitor 13 which permits the required value of inductor 12 to be readily realized in practice. Otherwise, the relatively larger inductance value required, although realizable in itself, has associated therewith so much stray capacitance that it is impractical if not impossible to achieve a resonance condition.

Figure 3:
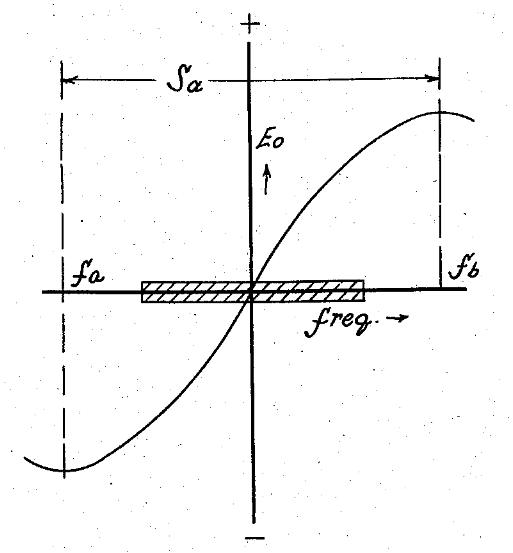
Fig. 3 is a graph of the output voltage vs. frequency characteristic of the network of Fig. 1.

In Fig. 3 the output voltage vs. frequency characteristic of the network is illustrated graphically. When the network is properly aligned, the reactance of the combination including the piezoelectric crystal 11 has the same value as that of capacitor 10 at the center of the operating band. In addition, the antiresonant and resonant frequencies are adjusted to fall above and below the center frequency by substantially the same amount so that the output voltage characteristic will be symmetrical. Since only a portion of the zero-pole spacing, $S_a$ is useable in most applications, as aforementioned, the maximum bandwidth that the applied signal can have is roughly defined by the shaded area in the central region of the frequency coordinate between $f_a$ and $f_b$. In terms of actual figures, the maximum useable bandwith is usually limited to 60 or 70% of the zero-pole spacing $S_a$.

Although in the preferred embodiment of the invention illustrated, a series inductor is provided to resonate with the shunt capacitance of the crystal, or more particularly that of the crystal and capacitor 13 in combination, optionally, an inductor like inductor 12 may be provided in parallel with the crystal. In this arrangement the parallel inductor is likewise adapted to resonate with these capacitances in the vicinity of the crystal resonant frequency to effect an increase in the zero-pole spacing $S_a$ as before, the difference in this case being that the antiresonant frequency of the crystal is effectively increased while the resonant frequency remains substantially the same. Because of the fact that the winding resistance inherent in the inductor tends to load the crystal in this optional shunt arrangement, thereby degrading the stability of the circuit, the arrangement with the series inductor as illustrated in Fig. 1 is preferred, however. In the series arrangement, the resistance effect of the inductor will be practically negligible since the inductance value of the inductor is always very much smaller than the crystal inductance $L_1$.

Various modifications of this nature that are within the spirit and scope of the invention will no doubt occur to those skilled in the art and, therefore, what is claimed is:

1. A discriminator network for the detection of a frequency modulated signal comprising a capacitive element; a piezoelectric element connected in series with said capacitive element; an inductive element connected in series with said capacitive and said piezoelectric elements to resonate with the shunt capacitance of the latter in the vicinity of the center frequency of said signal, the combination of said inductive element and said piezoelectric element having an impedance value which is equal to that of said capacitive element at the center frequency of said signal and which increases from a relatively low value at a frequency below the range of said signal to a relatively high value above said range, and balanced rectifier circuits coupled respectively to said capacitive element and to said combination including said piezoelectric element to provide a direct output voltage representative of the difference voltage thereacross developed by said signal.

2. A discriminator network for the detection of a frequency modulated signal comprising a first capacitive element; a piezoelectric element connected in series with said first capacitive element; a second capacitive element connected across said piezoelectric element to increase in effect the shunt capacitance thereof; and inductive element connected in series with said first capacitive element and the combination of said piezoelectric element with and said second capacitive element to resonate with the shunt capacitance of the latter in the vicinity of the center frequency of said signal, the combination of said inductive element, said second capacitive element and said piezoelectric element having an impedance value which is equal to that of said first capacitive element at the center frequency of said signal and which increases from a relatively low value at a frequency below the range of said signal to a relatively high value above said range, and balanced rectifier circuits coupled respectively to said first capacitive element and to said combination including said inductive element to provide a direct output voltage representative of the difference voltage thereacross developed by said signal.

References Cited in the file of this patent

UNITED STATES PATENTS

| | | |
|---|---|---|
| 2,702,343 | Trevor | Feb. 15, 1955 |
| 2,712,600 | Beckwith | July 5, 1955 |
| 2,724,089 | Ruston | Nov. 15, 1955 |

FOREIGN PATENTS

| | | |
|---|---|---|
| 621,694 | Great Britain | Apr. 14, 1949 |